(12) United States Patent
Choi

(10) Patent No.: US 7,884,661 B2
(45) Date of Patent: Feb. 8, 2011

(54) CLOCK GENERATOR CIRCUIT, METHOD OF CLOCK GENERATING, AND DATA OUTPUT CIRCUIT USING THE CLOCK GENERATING CIRCUIT AND METHOD

(75) Inventor: Byoung Jin Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 102 days.

(21) Appl. No.: 11/683,507

(22) Filed: Mar. 8, 2007

(65) Prior Publication Data

US 2008/0001638 A1 Jan. 3, 2008

(30) Foreign Application Priority Data

Jun. 30, 2006 (KR) .................. 10-2006-0061282

(51) Int. Cl.
G06F 1/04 (2006.01)
(52) U.S. Cl. .................. 327/291; 327/295; 327/296
(58) Field of Classification Search .................. 327/166, 327/172, 175, 176, 256, 257, 291, 295, 296, 327/299

See application file for complete search history.

(56) References Cited

U.S. PATENT DOCUMENTS

| 6,356,123 | B1 | 3/2002 | Lee et al. | |
| 6,909,312 | B2* | 6/2005 | Mitsumoto | 327/141 |
| 7,012,454 | B2* | 3/2006 | Matsui et al. | 327/114 |
| 7,187,217 | B2* | 3/2007 | Marutani | 327/117 |
| 7,239,189 | B2* | 7/2007 | Takayama | 327/161 |
| 2003/0090302 | A1* | 5/2003 | Hanamori | 327/113 |
| 2006/0244503 | A1* | 11/2006 | Lee | 327/291 |
| 2007/0210846 | A1* | 9/2007 | Wang | 327/276 |
| 2008/0104462 | A1* | 5/2008 | Volz et al. | 714/724 |

FOREIGN PATENT DOCUMENTS

| JP | 2005-244416 | 9/2005 |
| KR | 1019990053227 A | 7/1999 |
| KR | 1020040090180 A | 10/2004 |

* cited by examiner

*Primary Examiner*—Long Nguyen
(74) *Attorney, Agent, or Firm*—Ladas & Parry LLP

(57) ABSTRACT

A clock generating circuit generates a high frequency clock having a constant duty and the same period as that of an external clock. A clock generating circuit generates a clock signal (hereinafter "the clock") used for outputting a data signal to a data pin. The clock generating circuit includes at least a dividing portion and a clock generating portion. A dividing portion divides an internal clock signal (hereinafter "the internal clock") generated based on an external clock signal (hereinafter "the external clock") and outputs a plurality of divided clock signals (hereinafter "the divided clocks"). The clock generating portion performs a predetermined logical operations combining the divided clocks to generate the clock having a constant duty and the same period as the external clock.

55 Claims, 3 Drawing Sheets

CLOCK GENERATOR CIRCUIT, METHOD OF CLOCK GENERATING, AND DATA OUTPUT CIRCUIT USING THE CLOCK GENERATING CIRCUIT AND METHOD

CROSS-REFERENCE TO RELATED APPLICATIONS

The present application claims priority to Korean patent application number 10-2006-0061282 filed on Jun. 30, 2007, which is incorporated herein by reference in its entirety.

BACKGROUND OF THE INVENTION

The present invention relates to a semiconductor memory device, and more particularly to a clock generating circuit and a method of generating an internal clock having the same or substantially frequency of the external clock, and a data output circuit using the clock generating circuit and method.

In general, a Double Data Rate (DDR) DRAM increases the operation speed of the memory device by outputting two internal clock signals to a data pin for each external clock period at the rising edge of each external clock period. One internal clock signal generated is in phase with the external clock and the other internal clock generated is 180-degree out of phase with the external clock.

However, when the external clock period is shorter, stable performance of the DRAM requires the external clock period to be divided in order to generate an internal clock. The internal operation of the DRAM should then be synchronized with the internal clock, and an output signal to the outside of the DRAM should be synchronized with the external clock. Accordingly, the clock being synchronized with the external clock should be generated based upon the internal clock.

When a new clock is generated and subsequently synchronized with the external clock based upon the internal clock, adjusting the duty between the clocks (which having the same period) becomes difficult due to transistor characteristics.

Accordingly, there is a need for providing a circuit and a method of generating a clock having a same clock period with an exact duty based upon the internal clock.

SUMMARY OF THE INVENTION

Accordingly, the present invention provides a clock generating circuit and a clock generating method that generates an internal clock having the same period as the external clock.

The present invention also provides a clock generating circuit and a clock generating method that generates an internal clock in which the duty is constant and the same as that of the external clock. The present invention also outputs data to a data pin through a clock having the same period as that of the external clock and a duty ratio of 50:50.

The clock generating circuit according to an embodiment of the present invention generates a clock used for outputting a data signal to a data pin and comprises, inter alia, a dividing portion that divides an internal clock generated by an external clock; and a clock generating portion that combines the divided clocks to generate a clock having a constant duty and the same period as the external clock.

Preferably, the dividing portion divides the internal clock by N to generate 2N divided clocks in which the phase differences between each divided clock is 360/2N-degrees.

The clock generating portion comprises an amplifying portion including a first inverter group that inverts each of the divided clocks to generate inverted divided clocks; a second inverter group that inverts each of the inverted divided clocks again to generate delayed divided clocks; and a coding portion that combines the delayed or inverted divided clocks from the amplifying portion to generate an output clock.

The coding portion comprises a first clock output portion, including a first middle pulse generating portion that performs a NAND combination on pairs of the divided clocks to generate N first middle pulses, and a first pulse generating portion that performs a NAND combination on the N first middle pulses to generate a first clock that has the same period and phase as the external clock; and a second clock output portion, including a second middle pulse generating portion that performs a NAND combination on pairs of the divided clocks having a 360/2N-degree phase difference inputted into the first middle pulse generating portion to generate N second middle pulses, and a second pulse generating portion that performs a NAND combination on the N second middle pulses to generate a second clock that has the same period as the external clock but with a 180-degree phase difference.

Preferably, the first middle pulse generating portion performs a NAND combination on pairs of 2N divided clocks with a 360/2N-degree phase difference (N is the number by which the internal clock is divided) to thereby generate N first middle pulses having a 360/2N-degree phase difference.

The first middle pulse generating portion comprises N NAND gates that generate the N first middle pulses. The first middle pulse generating portion is also synchronized with the rising of the two divided clocks that are inputted into each of the NAND combinations to thereby generate a first middle clock formed with the rising and falling.

Preferably, the first middle clock generated by the middle pulse generating portion is in a low state only during a 360/2N interval within one period of the divided clock.

Preferably, the first pulse generating portion includes a NAND gate for performing a NAND combination on the N first middle pulses outputted from the first middle pulse generating portion, thereby generating the first clock.

Preferably, the first pulse generating portion performs a NAND combination on the N first middle pulses to generate the first clock such that it is in a low state, has a constant duty, and is multiplied by 1/N period of the divided clock during an interval in which the N first middle pulses are all in a high state.

The second middle pulse generating portion performs a NAND combination on the 2N divided clocks having a 360/2N-degree phase difference from the signals inputted into the first middle pulse generating portion sequentially in pairs to thereby generate N second middle pulses having a 360/2N-degree phase difference respectively, and comprises N NAND gates that generate the N second middle pulses.

Preferably, the second middle pulse generating portion is synchronized with the rising of the two divided clocks inputted into each of the NAND combinations that generate the second middle clock formed with the rising and falling, and generates a second middle clock that is in a low state only during a 360/2N interval within one period of the divided clock.

Preferably, the second pulse generating portion includes a NAND gate that performs a NAND combination on the N second middle pulses outputted from the second middle pulse generating portion to thereby generate a second clock that has a constant duty, is multiplied by 1/N period of the divided clock, and is in a low state during an interval in which the N second middle pulses are all in a high state.

Preferably, the dividing portion is shared with an internal clock dividing circuit, which is required for processing the data signal.

Preferably, the dividing portion is configured to exclusively output the data signal separately from the internal clock dividing circuit, which is required for processing the data signal.

The dividing portion uses a DLL clock or PLL clock as the internal clock.

The clock generating circuit comprises a first middle pulse generating portion, which is inputted by a pair of first input signals having a period of the external clock period multiplied by N (where N is an integer greater than 2) and having a 360/2N-degree phase difference, and includes N first middle pulse generating portions that generate a first middle pulse that is synchronized with the rising and falling of the pulse at the rising timing of each first input signal, and generates the first middle pulses that have a 360/2N-degree phase difference from one another from the N first middle pulse generating portions; a first pulse generating portion that logically combines the N first middle pulses outputted from the first middle pulse generating portion to generate a first clock that has the same period as that of the external clock; a second middle pulse generating portion, which is inputted by a pair of second input signals that have the same period as the first input signals but a 360/2N-degree phase difference from the first input signals, and includes N second middle pulse generating portions that generate a second middle pulse that is synchronized with the rising and falling of the pulse at the rising timing of each second input signal, and generates second middle pulses, which have a phase difference from one another, from the N second middle pulse generating portions; and a second pulse generating portion that logically combines the N second middle pulses outputted from the second middle pulse generating portion to generate a second clock that has the same period as that of the first clock but a 180-degree phase difference.

Preferably, the first input signals inputted into each of the first middle pulse generating portions have a 360/2N-degree phase difference from one another, and the first middle pulses outputted from each of the first middle pulse generating portions have a 360/2N-degree phase difference from one another.

Preferably, the second input signals inputted into each of the second middle pulse generating portions have a 360/2N-degree phase difference from one another, and the second middle pulses outputted from each of the second middle pulse generating portions have a 360/2N-degree phase difference from one another.

Preferably, the first and second middle pulse generating portions perform a NAND combination on a pair of signals that have a 360/2N-degree phase difference to thereby generate first and second middle pulses with a duty ratio of 1:2N-1, and the circuit is configured with NAND gates.

Preferably, the first and second middle pulse generating portion perform a NAND combination on the N first middle pulses that have a 360/2N-degree phase difference to thereby generate first and second pulses with a duty ratio of 1:1, and the circuit is configured with NAND gates.

The clock generating circuit further comprises buffers, which transmit first signals, and inverters, which provide second signals that have a 360/2N-degree phase difference from the first signal while being inverted such that they respectively correspond to the first and second middle pulse generating portions.

Preferably, the clock generating circuit further comprises first inverters, which invert signals with a 360/2N-degree phase difference, and second inverters, which invert the outputs of the first inverters, such that a pair of signals that have a 360/2N-degree phase difference from each other are among the outputs of the first inverters, and the outputs of the second inverters respectively correspond to the first and second middle pulse generating portions.

The method comprises the following steps of: (a) receiving an external clock to buffer the generation of an internal clock having the same period as that of the external clock; (b) dividing the internal clock by N using a dividing portion, thereby generating divided clocks; and (c) combining the divided clocks using the clock generating portion and multiplying the divided clock period by 1/N to thereby generate a clock that has a constant duty and the same period as that of the external clock.

Step (b) includes the step of dividing the internal clock by N to generate 2N divided clocks that have a 360/2N-degree phase difference between each of the divided clocks.

Step (c) comprises the following steps: (c1) inverting the 2N divided clocks respectively through a first inverter group to generate inverted divided clocks; (c2) inverting the 2N divided clocks respectively again through a second inverter group to generate delayed divided clocks; (c3) logically combining the first signals, including the inverted divided clocks and the delayed divided clocks, sequentially in pairs through the first middle pulse generating portion to generate N first middle pulses; (c4) logically combining the N first middle pulses through the first pulse generating portion to generate a first clock that has a constant duty and is multiplied by a 1/N period; (c5) logically combining the second signals, including the inverted divided clocks and the delayed divided clocks that have a 360/2N-degree phase difference respectively from the first signals, sequentially in pairs through the second middle pulse generating portion to generate N second middle pulses; and (c6) logically combining the N second middle pulses through the second pulse generating portion to generate a second clock that has a constant duty and is multiplied by a 1/N period but with a 180-degree phase difference from the first clock.

Preferably, in step (c3) a NAND combination is performed on 2N divided clocks, which have a 360/2N-degree phase difference from one another, sequentially in pairs, to thereby generate N first middle pulses that have a 360/2N-degree phase difference respectively.

Preferably, step (c3) is synchronized with the rising of the logically combined first clocks inputted into the first middle pulse generating portion to generate the first middle clock formed with the rising and falling.

Preferably, step (c3) generates the first middle clock in a low state only during a 360/2N interval within one period of the divided clock.

Preferably, in step (c4) a NAND combination is performed on the N first middle pulses to generate the first clock in a low state during an interval in which the N first middle pulses are all in a high state, thereby ensuring that the first clock has a constant duty and is synchronized with the external clock period.

Preferably, in step (c5) a NAND combination is performed on 2N divided clocks that have a 360/2N-degree phase difference respectively from the first signals sequentially in pairs, to thereby generate N second middle pulses that have a 360/2N-degree phase difference respectively.

Preferably, step (c5) is synchronized with the rising of the logically combined second clocks inputted into the second middle pulse generating portion to thereby generate the second middle clock formed with the rising and falling.

Preferably, step (c5) generates the second middle clock in a low state only during a 360/2N interval within one period of the divided clock.

Preferably, in step (c6) a NAND combination is performed on the N second middle pulses to generate the second clock in a low state during an interval in which the N second middle pulses are all in a high state, thereby ensuring that the second clock has a constant duty and is synchronized with the external clock period but also has a 180-degree phase difference from the first clock.

The clock generating method comprises the first step of inputting a pair of first input signals, which have the period of the external clock period multiplied by N (where N is an integer greater than 2) and a 360/2N-degree phase difference, and generating first middle pulses, which have a phase difference from one another, from N first middle pulse generating portions that generate the first middle pulse synchronized with the rising and falling of the pulse at the rising timing of each first input signal; a second step of logically combining the N first middle pulses generated in the first step, thereby generating a first clock that has the same period as that of the external clock; a third step of inputting a pair of second input signals that have the same period as that of the first input signals but a 360/2N-degree phase difference from the first input signals, and generating second middle pulses, which have a phase difference from one another, from the N second middle pulse generating portions that generate a second middle pulse synchronized with the rising and falling of the pulse at the rising timing of each second input signal; and a fourth step of logically combining the N second middle pulses generated in the third step to generate a second clock that has the same period as that of the first clock but a 180-degree phase difference.

Preferably, the first input signals inputted into each of the first middle pulse generating portions have a 360/2N-degree phase difference from one another.

Preferably, the first middle pulses outputted from each of the first middle pulse generating portions have a 360/2N-degree phase difference from one another.

Preferably, the second input signals inputted into each of the second middle pulse generating portions have a 360/2N-degree phase difference from one another.

Preferably, the second middle pulses outputted from each of the second middle pulse generating portions have a 360/2N-degree phase difference from one another.

Preferably, the first and second middle pulses have a duty ratio of 1:2N-1 when a NAND combination is performed on a pair of signals having a 360/2N-degree phase difference.

Preferably, the first and second middle pulses have a duty ratio of 1:1 when a NAND combination is performed on each of the first and second pulses.

The clock generating method further comprises inverting the signals respectively having a 360/2N-degree phase difference to generate first signals, inverting the first signals again to generate second signals, and pairing the first signals and second signals that have a 360/2N-degree phase difference to respectively correspond to the first and second middle pulse generating portions.

These and various other features as well as advantages which characterize the present invention will be apparent from a reading of the following detailed description and a review of the associated drawings.

DESCRIPTION OF SPECIFIC EMBODIMENTS

Figure 1:
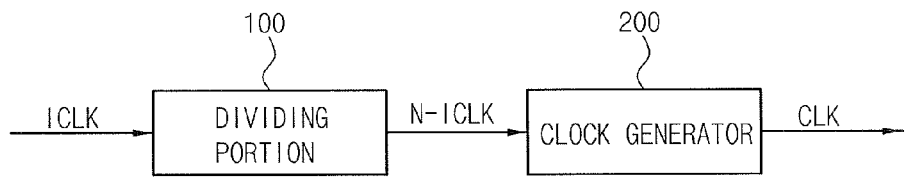
FIG. 1 is a block diagram illustrating the generation of a clock according to an embodiment of the present invention.

As shown in FIG. 1, a clock generating circuit according to an embodiment of the present invention includes at least a dividing portion 100 and a clock generating portion 200.

An internal clock ICLK is outputted from the external receiving clock unit 500 from an externally received inputted clock (i.e., an external clock (EXT-CLK)) and the ICLK has the same period as that of the external clock. It is noted that the term "clock" is used simply to refer to a "clock signal" in this disclosure.

N_ICLK is a divided clock signal produced by dividing the period of the internal clock ICLK by N in the dividing portion 100. N_ICLK is produced for situations where applying the internal clock ICLK to an internal operation of the DRAM becomes difficult due to external clocks operating in high-speed.

CLK is generated in the clock generating portion 200 by combining the divided clocks N_ICLK. The clock signal CLK has 50:50 duty ratio, and has the same period as that of the external clock, and is used for outputting data from a DRAM.

The dividing portion 100 can be configured by using a delay-locked loop (DLL) or a phase-locked loop (PLL). The dividing portion 100 generates a 2N number of the divided clocks N_ICLK by dividing the internal clock ICLK by N. Preferably, each of these divided clocks N_ICLK is generated such that they have a 360/2N-degree phase difference.

Furthermore, the clock generating portion 200 combines the 2N number of the divided clock signals N_ICLK, which are from ICLK divided by N in the dividing portion 100, to generate a clock signal CLK that has a constant duty and the same period as that of the external clock.

Figure 2:
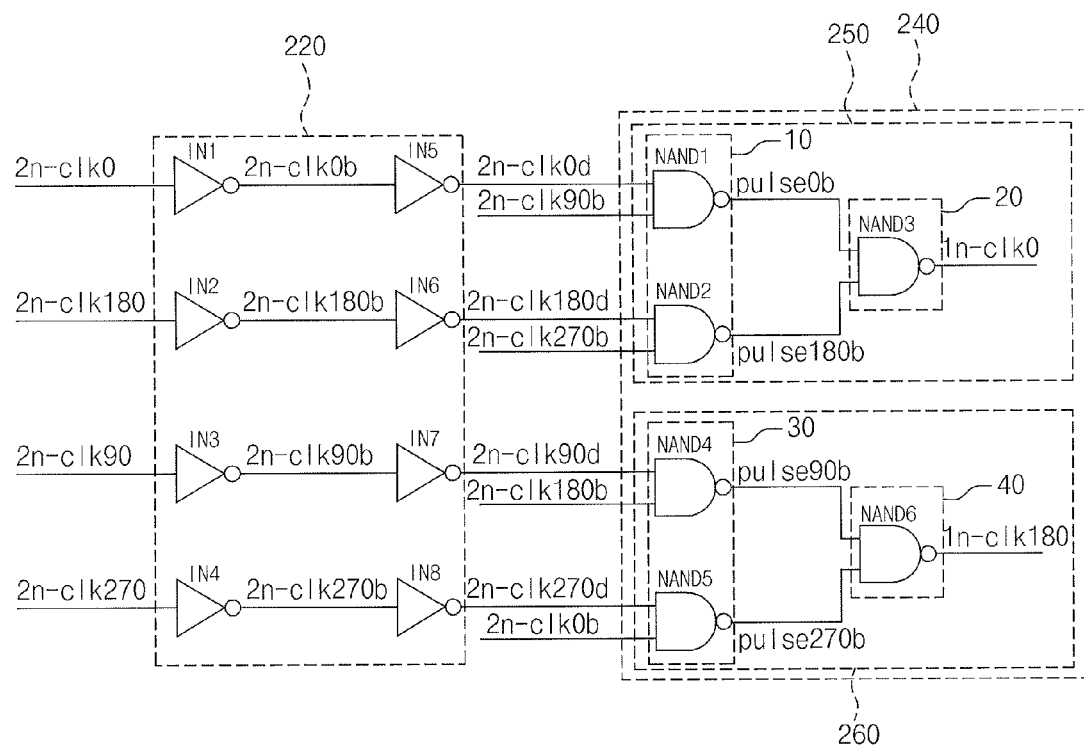
FIG. 2 is a circuit diagram illustrating an example of the clock generating portion of FIG. 1.
Figure 3:
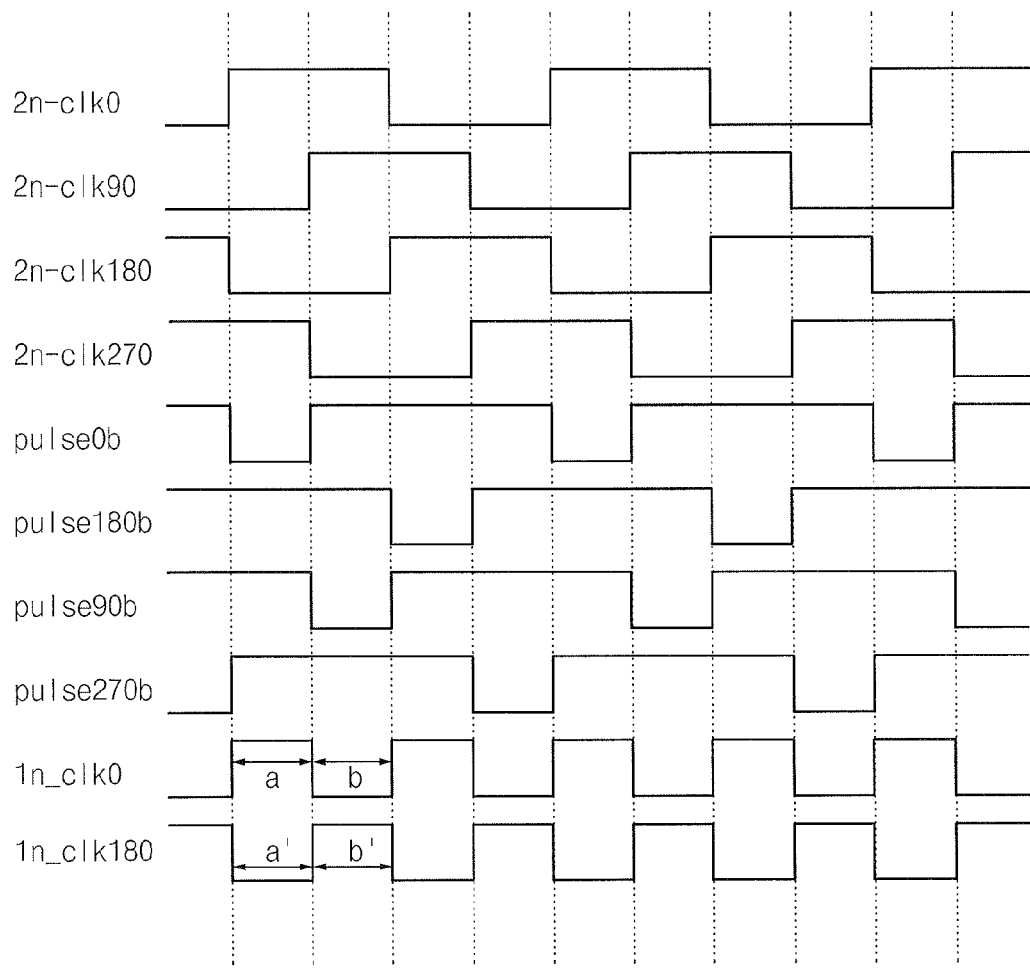
FIG. 3 is a signal waveform diagram related to FIG. 2.

FIG. 2 is a circuit diagram illustrating an example of the clock generating portion 200 of FIG. 1, and FIG. 3 is a signal waveform diagram related to FIG. 2.

Referring to FIGS. 2 and 3, shown therein is an example of the clock generating portion 200, which combines four divided clocks N_ICLK generated by the division of the internal clock ICLK by 2 in the dividing portion 100 to generate a clock CLK that has a constant duty and the same period as that of the external clock.

As described above, four divided clocks N_ICLK, which are divided in the dividing portion 100, have a 90-degree phase difference, respectively. Reflecting this, the first divided clock N_ICLK is shown as $2n\_clk0$, the second divided clock N_ICLK as $2n\_clk90$, the third divided clock N_ICLK as $2n\_clk180$, and the fourth and final divided clock N_ICLK as $2n\_clk270$.

Furthermore, the divided clock $2n\_clk0$ *is advanced by* 90 degrees in phase from the divided clock $2n\_clk90$. Similarly, the divided clock $2n\_clk90$ is advanced by 90 degrees in phase from the divided clock $2n\_clk180$; the divided clock $2n\_clk180$ is advanced by 90 degrees in phase from the divided clock $2n\_clk270$; and the divided clock $2n\_clk270$ is advanced by 90 degrees in phase from the divided clock $2n\_clk0$ of the one that is one period behind.

The clock generating portion 200 includes an amplifying portion 220, which delays and amplifies each of the divided clocks ($2n\_clk0$, $2n\_clk90$, $2n\_clk180$, $2n\_clk270$), and a coding portion 240, which combines each of the delayed and amplified divided clocks ($2n\_clk0$, $2n\_clk90$, $2n\_clk180$, $2n\_clk270$) to generate output clocks.

The amplifying portion 220, including a first inverter group (IN1, IN2, IN3, IN4), inverts each respective one of the divided clocks (2n_clk0, 2n_clk90, 2n_clk180, 2n_clk270) to generate inverted divided clocks (2n_clk0b, 2n_clk90b, 2n_clk180b, 2n_clk270b). Moreover, by including a second inverter group (IN5, IN6, IN7, IN8), it inverts each respective one of the inverted divided clocks again to generate delayed divided clocks (2n_clk0d, 2n_clk90d, 2n_clk180d, 2n_clk270d).

The coding portion 240 includes a first clock output portion 250 and a second clock output portion 260.

The first clock output portion 250 includes a first middle pulse generating portion 10 and a first pulse generating portion 20 to generate a first clock 1n_clk0, which has a constant duty and the same period and phase as that of the external clock.

Preferably, the first middle pulse generating portion 10 includes N NAND gates each having two input signals. Here, it includes two NAND gates (NAND1, NAND2) each having two input signals.

Preferably, the first pulse generating portion 20 includes one NAND gate having N input signals. Here, it is configured with a NAND gate (NAND3) having two input signals.

Looking into an operation of the first clock output portion 250, first, the first middle pulse generating portion 10 combines the delayed divided clock 2n_clk0d delaying the divided clock 2n_clk0 and the inverted divided clock 2n_clk90b inverting the divided clock 2n_clk90 to thereby generate a middle pulse pulse0b in the NAND gate (NAND1). Furthermore, it combines the delayed divided clock 2n_clk180d delaying the divided clock 2n_clk180 and the inverted divided clock 2n_clk270b inverting the divided clock 2n_clk270 to thereby generate a middle pulse pulse180b in the NAND gate (NAND2).

In other words, in the first middle pulse generating portion 10, a pair of signals that have a 90-degree phase difference from each other (delayed divided clock 2n_clk0d, inverted divided clock 2n_clk90b) is inputted into the NAND gate (NAND1) to generate a middle pulse pulse0b, which is synchronized with the rising and falling of the pulse at each rising timing of the input signals. Accordingly, the middle pulse pulse0b is in a low state during the interval 0 to 90 degrees and maintains a high state in the remaining interval 270 degrees.

Similarly, another pair of signals (delayed divided clock 2n_clk180d, inverted divided clock 2n_clk270b) is inputted into the NAND gate (NAND2) to generate a middle pulse pulse180b, which is synchronized with the rising and falling of the pulse at each rising timing of the inputted signals. Accordingly, the middle pulse pulse180b is in a low state during the interval 180 to 270 degrees and maintains a high state in the remaining interval. Accordingly, it has a 180-degree phase difference from the middle pulse pulse0b.

In this way, the first middle pulse generating portion 10 performs a NAND combination on 2N divided clocks that have a 360/2N-degree phase difference from one another (here, N is the number by which the internal clock is divided) sequentially in pairs to generate N middle pulses. Furthermore, the N middle pulses have a 360/2N-degree phase difference from one another.

Then, the first pulse generating portion 20 performs a NAND combination on the two middle pulses (pulse0b, pulse180b) outputted from the first middle pulse generating portion 10 through a NAND gate (NAND3) to thereby generate a first clock 1n_clk0. In other words, since the first clock 1n_clk0 is in a low state during the interval in which both the middle pulses pulse0b and pulse180b are in a high state, it is in a low state between 90 degrees and 180 degrees and between 270 degrees and 0 degree of the next period. Accordingly, the first clock 1n_clk0 is generated as a clock that has a constant duty where the low and high intervals are same.

In this way, the first pulse generating portion 20 combines N middle pulses that have a 360/2N-degree phase difference from one another to generate a high-speed first clock 1n_clk0 that has a constant duty (a=b) and the same period and phase as that of the external clock.

In addition to this, the second clock output portion 260 includes a second middle pulse generating portion 30 and a second pulse generating portion 40 to generate a second clock 1n_clk180 that has a constant duty and the same period as the external clock but with a 180-degree phase difference.

Preferably, the second middle pulse generating portion 30 includes a N number of NAND gates each having two input signals. Shown in FIG. 2, the second middle pulse generating portion includes two NAND gates (NAND4, NAND5) each with two input signals (2n-clk90d, 2n-clk180b and 2n-clk270d, 2nclk0b).

Preferably, the second pulse generating portion 40 includes one NAND gate that receives a N number of input signals. Here in FIG. 2, the second pulse generating portion 40 is configured with one NAND gate (NAND6) receiving two input signals pulse90b, pulse270b.

Looking into the operation of the second clock output portion 260, first, the second middle pulse generating portion 30 combines the delayed divided clock 2n_clk90d delaying the divided clock 2n_clk90 and the inverted divided clock 2n_clk180b inverting the divided clock 2n_clk180 to generate a middle pulse pulse90b in the NAND gate (NAND4). Furthermore, the second middle pulse generating portion 30 combines the delayed divided clock 2n_clk270d delaying the divided clock 2n_clk270 and the inverted divided clock 2n_clk0b inverting the divided clock 2n_clk0 of the next period to generate a middle pulse pulse270b in the NAND gate (NAND5).

More specifically, the second middle pulse generating portion 30 performs a NAND combination on the signals inputted into the first middle pulse generating portion 10 and the divided clocks that have a 90-degree (that is, 360/2N-degrees) phase difference from one another sequentially in pairs to generate two second middle pulses (pulse90b, pulse270b).

In other words, a pair of signals having a 90-degree phase difference from each other (delayed divided clock 2n_clk90d, inverted divided clock 2n_clk180b) are inputted into the NAND gate (NAND4) to generate a middle pulse pulse90b, which is synchronized with the rising and falling edges of the middle pulse pulse90b at each rising timing of the input signals 2n-clk90d, 2n-clk180b. Accordingly, the middle pulse pulse90b is in a low state during the interval 90 to 180 degrees and maintains a high state in the remaining interval 270 degrees.

Similarly, another pair of signals (delayed divided clock 2n_clk270d, inverted divided clock 2n_clk0b) are inputted into the NAND gate (NAND5) to generate a middle pulse pulse270b, such that the rising and falling edges of the middle pulse pulse270b is synchronized with each rising timing of the inputted signals 2n-clk270d, 2n-clk0b. Thus, the middle pulse pulse270b is in a low state in the interval 270 degree to 0 degree beginning the next period, and maintains a high state in the remaining interval. Accordingly, the middle pulse pulse270b has a 180-degree phase difference from the pulse90b.

In this way, the second middle pulse generating portion 30 performs a NAND combination on 2N divided clocks that have a 360/2N-degree phase difference from one another (here, N is the number by which an internal clock is divided) sequentially in pairs to generate N middle pulses. Furthermore, the N middle pulses have a 360/2N-degree phase difference from one another.

Then, the second pulse generating portion 40 performs a NAND combination through a NAND gate (NAND6) on the two middle pulses (pulse90*b*, pulse270*b*) from the first second pulse generating portion 30 to generate a second clock 1*n*_clk180. In other words, since the second clock 1*n*_clk180 is in a low state during the interval in which both the middle pulse pulse90*b* and the middle pulse pulse270*b* are in a high state, it is in a low state between 0 degree and 90 degree, and between 180 degree and 270 degree. Accordingly, the second clock 1*n*_clk180 is generated as a clock that has a constant duty where the low and high intervals are same.

In this way, the second pulse generating portion 40 combines N middle pulses that have a 360/2N-degree phase difference from one another to generate a second clock 1*n*_clk180 that has a constant duty a (a'=b') and the same period as the external clock but with a 180-degree phase difference.

As described above, according to an embodiment as shown in FIG. 2 where N equals 2, the dividing portion 100 divides an internal clock ICLK to generate four divided clocks (2*n*_clk0, 2*n*_clk90, 2*n*_clk180, 2*n*_clk270) that have a 90-degree phase difference respectively; generates four middle pulses (2*n*_clk0*b*, 2*n*_clk90*b*, 2*n*_clk180*b*, 2*n*_clk270*b*) by using each rising edge of the divided clocks; and generates clocks (1*n*_clk0, 1*n*_clk180) that have a constant duty and the same period as the external clock using four middle pulses, thereby improving the operating stability and speed of the semiconductor device.

In an embodiment of the present invention as described above, though it is illustrated and described that when an internal clock ICLK having the same period as the external clock is divided by N which being 2 through a dividing portion, a clock CLK (a first clock 1*n*_clk0) that has a constant duty and the same period and phase as the external clock and a clock CLK (a second clock 1*n*_clk180) that has a constant duty and the same period as the external clock but with a 180-degree phase difference are generated in the clock generating portion 200 by using four divided clocks N_ICLK having a 90-degree phase difference from one another, such a method contemplated by the present invention is also applicable to a situation in which the internal clock ICLK is divided by N, the afore-mentioned first clock 1*n*_clk0 and second clock 1*n*_clk180 are generated in the clock generating portion 200 by using 2N divided clocks N_ICLK that have a 360/2N-degree phase difference from one another.

Figure 4:
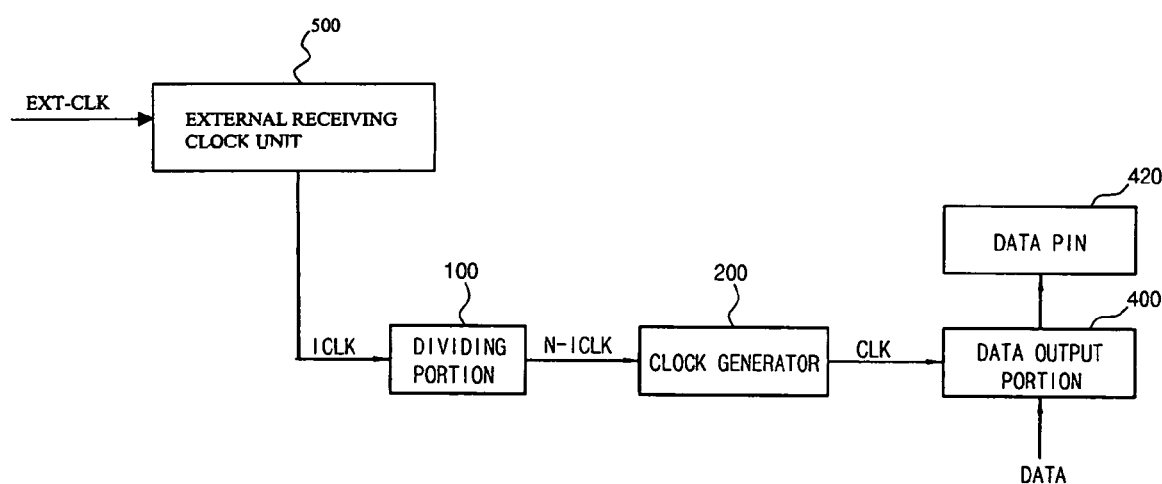
FIG. 4 is a block diagram illustrating a data output circuit according to an embodiment of the present invention.

As described above, according to an embodiment of the present invention, a clock CLK that has the same period as the external clock can be provided for outputting data as illustrated in FIG. 4. In FIG. 4, the configuration and operation of the dividing portion 100 and the clock generating portion 200 is identical to the embodiment as illustrated in FIGS. 1 and 2.

In FIG. 4, a data output portion 400 outputs data to a data pin 420 by synchronizing with the clock CLK provided from the clock generating portion 200.

The clock CLK has the same period as the external clock and a duty ratio of 50:50 as described in FIGS. 1 and 2. As a result, the data output portion 400 can output data at a high speed in a stable environment.

Accordingly, a clock having the same period as an external clock with a constant duty is generated based upon an internal clock, thereby improving the operating stability and speed of a semiconductor device.

Furthermore, the internal clock generating circuit and clock generating method generates a high-speed clock with a constant duty as an internal clock, thereby improving the operating stability and speed of a semiconductor device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A clock generating circuit generating a clock signals (hereinafter "the clocks") used for outputting a data signal to a data pin, the clock generating circuit comprising:
   a dividing portion dividing an internal clock signal (hereinafter "the internal clock") generated based on an external clock signal (hereinafter "the external clock") by N and outputting 2N divided clock signals (hereinafter "the divided clocks") having a 360/2N-dgree phase difference between each of the divided clocks;
   a clock generating portion performing a predetermined logical operations combining the divided clocks to generate N number of the clocks having a constant duty and the same period as the external clock,
   wherein N is an integer greater than 1,
   wherein the clock generating portion comprises:
   an amplifying portion comprising:
   a first inverter group generating a plurality of inverted divided clocks by inverting the plurality of divided clocks; and
   a second inverter group generating a plurality of delayed divided clocks by inverting the plurality of inverted divided clocks; and
   a coding portion generating an output clock by performing predetermined logical operations that combine the delayed and inverted divided clocks,
   wherein the coding portion comprises:
   a first clock output portion comprising:
   a first middle pulse generating portion that performs a NAND logical operation on the divided clocks in pairs to generate N first middle pulses, and
   a first pulse generating portion that performs a NAND combination on the N first middle pulses to generate a first clock, thereby generating the first clock that has the same period and phase as the external clock; and
   a second clock output portion comprising:
   a second middle pulse generating portion that performs a NAND combination on the divided clocks having a 360/2N-degree phase difference respectively from the signals inputted into the first middle pulse generating portion in pairs to generate N second middle pulses, and a second pulse generating portion that performs a NAND combination on the N second middle pulses to generate a second clock, thereby generating the second clock that has the same period as the external clock but a 180-degree phase difference.

2. The clock generating circuit according to claim 1, wherein the first middle pulse generating portion performs a NAND combination on 2N divided clocks having a 360/2N-degree phase difference (N is the number by which the internal clock is divided) from one another sequentially in pairs to generate N first middle pulses that have a 360/2N-degree phase difference, respectively.

3. The clock generating circuit according to claim 2, wherein the first middle pulse generating portion comprises N NAND gates that generate the N first middle pulses.

4. The clock generating circuit according to claim 1, wherein the first middle pulse generating portion is synchronized with the rising of the two divided clocks inputted into each of the NAND combination to generate the first middle clock formed with the rising and falling.

5. The clock generating circuit according to claim 1, wherein the first middle pulse generating portion generates the first middle clock in a low state only during a 360/2N interval within one period of the divided clock.

6. The clock generating circuit according to claim 1, wherein the first pulse generating portion includes a NAND gate for performing a NAND combination on the N first middle pulses outputted from the first middle pulse generating portion to generate a first clock.

7. The clock generating circuit according to claim 1, wherein the first pulse generating portion performs a NAND combination on the N first middle pulses to generate the first clock such that the first clock is in a low state during an interval where the N first middle pulses are all in a high state, and has a constant duty and is multiplied by 1/N period of the divided clock.

8. The clock generating circuit according to claim 1, wherein the second middle pulse generating portion performs a NAND combination on 2N divided clocks having a 360/2N-degree phase difference from the signals inputted into the first middle pulse generating portion sequentially in pairs to generate N second middle pulses having a 360/2N-degree phase difference, respectively.

9. The clock generating circuit according to claim 8, wherein the second middle pulse generating portion comprises N NAND gates that generate the N second middle pulses.

10. The clock generating circuit according to claim 1, wherein the second middle pulse generating portion is synchronized with the rising of the two divided clocks inputted into each of the NAND gates to generate the second middle clock formed with the rising and falling.

11. The clock generating circuit according to claim 1, wherein the second middle pulse generating portion generates the second middle clock such that the second middle clock is in a low state only during a 360/2N interval within one period of the divided clock.

12. The clock generating circuit according to claim 1, wherein the second pulse generating portion includes a NAND gate for performing a NAND combination on the N second middle pulses outputted from the second middle pulse generating portion to generate a second clock.

13. The clock generating circuit according to claim 1, wherein the second pulse generating portion performs a NAND combination on the N second middle pulses to generate the second clock, which is in a low state during an interval where the N second middle pulses are all in a high state and has a constant duty and is multiplied by 1/N period of the divided clock.

14. The clock generating circuit according to claim 1, wherein the dividing portion uses a DLL clock as an internal clock.

15. The clock generating circuit according to claim 1, wherein the dividing portion uses a PLL clock as an internal clock.

16. A clock generating circuit, comprising:
a first middle pulse generating portion that is inputted by a pair of first input signals having the period of an external clock period multiplied by N (where N is an integer greater than 2) and having a 360/2N-degree phase difference, and includes N first middle pulse generating portions generating a first middle pulse synchronized with a rising and a falling of the pulse at a rising timing of the each first input signal, and generates the first middle pulses having a 360/2N-degree phase difference from one another from the N first middle pulse generating portions;
a first pulse generating portion that logically combines the N first middle pulses outputted from the first middle pulse generating portion to generate a first clock having the same period as that of the external clock;
a second middle pulse generating portion that is inputted by a pair of second input signals having the same period as the first input signals but a 360/2N-degree phase difference from the first input signals, and includes N second middle pulse generating portions generating a second middle pulse synchronized with the rising and falling of the pulse at the rising timing of each second input signal, and generates the second middle pulses having a phase difference from one another from the N second middle pulse generating portions; and
a second pulse generating portion that logically combines the N second middle pulses outputted from the second middle pulse generating portion to generate a second clock having the same period as the first clock but a 180-degree phase difference,
wherein the first input signals inputted to the first middle pulse generating portion have a 360/2N-degree phase difference from one another.

17. The clock generating circuit according to claim 16, wherein the first middle pulses outputted from the first middle pulse generating portion have a 360/2N-degree phase difference from one another.

18. The clock generating circuit according to claim 16, wherein the second input signals inputted to the second middle pulse generating portion have a 360/2N-degree phase difference from one another.

19. The clock generating circuit according to claim 16, wherein the second middle pulses outputted from the second middle pulse generating portion have a 360/2N-degree phase difference from one another.

20. The clock generating circuit according to claim 16, wherein the first and the second middle pulse generating portions perform a NAND combination on a pair of signals having a 360/2N-degree phase difference to generate the first and the second middle pulses having a duty ratio of 1:2N-1.

21. The clock generating circuit according to claim 20, wherein the first and the second middle pulse generating portions are configured with NAND gates.

22. The clock generating circuit according to claim 16, wherein the first and the second middle pulse generating portion perform a NAND combination on the N first middle pulses having a 360/2N-degree phase difference to generate the first and the second pulses having a duty ratio of 1:1.

23. The clock generating circuit according to claim 22, wherein the first and second pulse generating portion are configured with NAND gates.

24. The clock generating circuit according to claim 16, wherein the clock generating circuit further comprises buffers that transmit first signals and inverters that provide second signals having a 360/2N-degree phase difference from the first signal while being inverted so as to respectively correspond to the first and the second middle pulse generating portions.

25. The clock generating circuit according to claim 16, wherein the clock generating circuit further comprises first inverters that invert signals respectively having a 360/2N-degree phase difference and second inverters that invert the outputs of the first inverters such that a pair of signals having a 360/2N-degree phase difference from each other among the outputs of the first inverters and the outputs of the second inverters respectively correspond to the first and second middle pulse generating portions.

26. A clock generating method, comprising the steps of:
- (a) receiving an external clock to a buffer to generate an internal clock having the same period as that of the external clock;
- (b) dividing the internal clock by N through a dividing portion to generate 2N divided clocks that have a 360/2N-degree phase difference between each of the divided clocks, wherein N is an integer greater than 1; and
- (c) combining the divided clocks through a clock generating portion and multiplying the divided clock period by 1/N to generate a clock having the same period as the external clock with a constant duty, wherein step (c) comprises the steps of:
- (c1) inverting the 2N divided clocks respectively through a first inverter group to generate inverted divided clocks;
- (c2) inverting the 2N divided clocks respectively again through a second inverter group to generate delayed divided clocks;
- (c3) logically combining first signals including the inverted divided clocks and the delayed divided clocks sequentially in pairs through a first middle pulse generating portion to generate N first middle pulses;
- (c4) logically combining the N first middle pulses through the first pulse generating portion to generate a first clock multiplied by 1/N period having a constant duty;
- (c5) logically combining second signals including the inverted divided clocks and the delayed divided clocks having a 360/2N-degree phase difference respectively from the first signals, sequentially in pairs through a second middle pulse generating portion to generate N second middle pulses; and
- (c6) logically combining the N second middle pulses through the second pulse generating portion to generate a second clock multiplied by 1/N period having a constant duty but a 180-degree phase difference from the first clock, wherein in step (c3), a NAND combination is performed on 2N divided clocks having a 360/2N-degree phase difference from one another sequentially in pairs to generate N first middle pulses having a 360/2N-degree phase difference, respectively.

27. The clock generating method according to claim 26, wherein step (c3) is synchronized with the rising of the logically combined first signals inputted through the first middle pulse generating portion to generate the first middle pulses formed with the rising and falling.

28. The clock generating method according to claim 26, wherein step (c3) generates the first middle pulses such that the first middle pulses are is in a low state only during a 360/2N interval within one period of the divided clock.

29. The clock generating circuit according to claim 26, wherein in step (c4), a NAND combination is performed on the N first middle pulses to generate the first clock such that the first clock is in a low state during an interval where the N first middle pulses are all in a high state, thereby having a constant duty and being synchronized with the external clock period.

30. The clock generating method according to claim 26, wherein in step (c5), a NAND combination is performed on 2N divided clocks having a 360/2N-degree phase difference respectively from the first signals sequentially in pairs to generate N second middle pulses having a 360/2N-degree phase difference, respectively.

31. The clock generating method according to claim 26, wherein step (c5) is synchronized with the rising of the logically combined second signals inputted through the second middle pulse generating portion to generate the second middle pulses formed with the rising and falling.

32. The clock generating method according to claim 26, wherein step (c5) generates the second middle pulses such that the second middle pulses are in a low state only during a 360/2N interval within a period of the divided clock.

33. The clock generating circuit according to claim 26, wherein in step (c6), a NAND combination is performed on the N second middle pulses to generate the second clock such that the second clock is in a low state during an interval where the N second middle pulses are all in a high state, thereby having a constant duty and being synchronized with the external clock period but having a 180-degree phase difference from the first clock.

34. A clock generating method, comprising:
- a first step of inputting a pair of first input signals having the period of an external clock period multiplied by N (where N is an integer greater than 2) and having a 360/2N-degree phase difference, and generating first middle pulses having a phase difference from one another from N first middle pulse generating portions that generate a first middle pulse synchronized with the rising and falling of the pulse at the rising timing of each first input signal;
- a second step of logically combining the N first middle pulses generated in the first step to generate a first clock having the same period as that of the external clock;
- a third step of inputting a pair of second input signals having the same period as that of the first input signals but a 360/2N-degree phase difference from the first input signals, and generating second middle pulses having a phase difference from one another from the N second middle pulse generating portions that generate a second middle pulse synchronized with the rising and falling of the pulse at the rising timing of each second input signal; and
- a fourth step of logically combining the N second middle pulses generated in the third step to generate a second clock having the same period as that of the first clock but a 180-degree phase difference, wherein the first and second middle pulses have a duty ratio of 1:2N-1 by performing a NAND combination on a pair of signals having a 360/2N-degree phase difference.

35. The clock generating method according to claim 34, wherein the first input signals inputted into each of the first middle pulse generating portions have a 360/2N-degree phase difference from one another.

36. The clock generating method according to claim 34, wherein the first middle pulses outputted from each of the first middle pulse generating portions have a 360/2N-degree phase difference from one another.

37. The clock generating method according to claim 34, wherein the second input signals inputted into each of the second middle pulse generating portions have a 360/2N-degree phase difference from one another.

38. The clock generating method according to claim 34, wherein the second middle pulses outputted from each of the second middle pulse generating portions have a 360/2N-degree phase difference from one another.

39. The clock generating method according to claim 34, wherein the first and second middle pulses have a duty ratio of 1:1 by performing a NAND combination on each of the first and the second pulses.

40. The clock generating method according to claim 34, characterized by further comprising the step of inverting, the signals respectively having a 360/2N-degree phase difference to generate first signals, inverting the first signals again to generate second signals, and selecting the first signals and the second signals having a 360/2N-degree phase difference as a pair of signals to respectively correspond to the first and the second middle pulse generating portions.

41. A data output circuit, comprising:
- a dividing portion that divides an internal clock generated by an external clock by N to generate 2N divided clocks that have a 360/2N-degree phase difference between each of the divided clocks, and
- wherein N is an integer greater than 1;
- a clock generating portion that combines the divided clocks divided through the dividing portion to generate N clock having a constant duty and having the same period as the external clock;
- a data pin that outputs data; and
- a data output portion that synchronizes the data with the N clocks generated from the clock generating portion to output the data pin,
- wherein the clock generating portion comprises an amplifying portion including a first inverter group that inverts each of the divided clocks to generate inverted divided clocks; a second inverter group that inverts again each of the inverted divided clocks to generate delayed divided clocks; and a coding portion that combines delayed or inverted divided clocks from the amplifying portion to generate an output clock,
- wherein the coding portion comprises a first clock output portion including a first middle pulse generating portion that performs a NAND combination on the divided clocks in pairs to generate N first middle pulses, and a first pulse generating portion that performs a NAND combination on the N first middle pulses to generate a first clock, thereby generating a first clock having the same period and phase as the external clock; and a second clock output portion including a second middle pulse generating portion that performs a NAND combination on the divided clocks having a 360/2N-degree phase difference respectively from the signals inputted into the first middle pulse generating portion in pairs to generate N second middle pulses, and a second pulse generating portion that performs a NAND combination on the N second middle pulses to generate a second clock, thereby generating a second clock having the same period as the external clock but a 180-degree phase difference.

42. The data output circuit according to claim 41, wherein the first middle pulse generating portion performs a NAND combination on 2N divided clocks having a 360/2N-degree phase difference (N is the number by which an internal clock is divided) from one another sequentially in pairs to generate N first middle pulses having a 360/2N-degree phase difference, respectively.

43. The data output circuit according to claim 42, wherein the first middle pulse generating portion comprises N NAND gates that generate the N first middle pulses.

44. The data output circuit according to claim 41, wherein the first middle pulse generating portion is synchronized with the rising of the two divided clocks inputted into each of the NAND combination to generate the first middle clock formed with the rising and falling.

45. The data output circuit according to claim 41, wherein the first middle pulse generating portion generates the first middle clock such that the first middle clock is in a low state only during a 360/2N interval within one period of the divided clock.

46. The data output circuit according to claim 41, wherein the first pulse generating portion includes a NAND gate for performing a NAND combination on the N first middle pulses outputted from the first middle pulse generating portion to generate a first clock.

47. The data output circuit according to claim 41, wherein the first pulse generating portion performs a NAND combination on the N first middle pulses to generate the first clock such that the first clock is in a low state during an interval where the N first middle pulses are all in a high state, and has a constant duty and is multiplied by 1/N period of the divided clock.

48. The data output circuit according to claim 41, wherein the second middle pulse generating portion performs a NAND combination on 2N divided clocks having a 360/2N-degree phase difference from the signals inputted into the first middle pulse generating portion sequentially in pairs to generate N second middle pulses having a 360/2N-degree phase difference, respectively.

49. The data output circuit according to claim 48, wherein the second middle pulse generating portion comprises N NAND gates that generate the N second middle pulses.

50. The data output circuit according to claim 41, wherein the second middle pulse generating portion is synchronized with the rising of the two divided clocks inputted into each of the NAND combinations to generate the second middle clock formed with the rising and falling.

51. The data output circuit according to claim 41, wherein the second middle pulse generating portion generates the second middle clock such that the second middle clock is in a low state only during a 360/2N interval within one period of the divided clock.

52. The data output circuit according to claim 41, wherein the second pulse generating portion includes a NAND gate for performing a NAND combination on the N second middle pulses outputted from the second middle pulse generating portion to generate a second clock.

53. The data output circuit according to claim 41, wherein the second pulse generating portion performs a NAND combination on the N second middle pulses to generate the second clock such that the second clock is in a low state during an interval where the N second middle pulses are all in a high state, and has a constant duty and is multiplied by 1/N period of the divided clock.

54. The data output circuit according to claim 41, wherein the dividing portion uses a DLL clock as an internal clock.

55. The data output circuit according to claim 41, wherein the dividing portion uses a PLL clock as an internal clock.

\* \* \* \* \*